(12) United States Patent
Ray

(10) Patent No.: US 11,381,227 B1
(45) Date of Patent: Jul. 5, 2022

(54) VARIABLE FREQUENCY COMB GENERATION

(71) Applicant: The Boeing Company, Chicago, IL (US)

(72) Inventor: Gary A. Ray, Issaquah, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 17/452,321

(22) Filed: Oct. 26, 2021

Related U.S. Application Data

(60) Provisional application No. 63/133,550, filed on Jan. 4, 2021.

(51) Int. Cl.
| | | |
|---|---|---|
| H03K 5/00 | (2006.01) | |
| H03K 5/01 | (2006.01) | |
| H03K 4/92 | (2006.01) | |

(52) U.S. Cl.
CPC ............... *H03K 5/01* (2013.01); *H03K 4/92* (2013.01)

(58) Field of Classification Search
None
See application file for complete search history.

(56) References Cited

U.S. PATENT DOCUMENTS

| | | | | |
|---|---|---|---|---|
| 9,093,983 | B1* | 7/2015 | Lam | H03H 17/0248 |
| 9,214,973 | B1* | 12/2015 | Venkatesh | H03H 17/04 |
| 9,608,598 | B1* | 3/2017 | Melanson | H03H 17/0685 |
| 9,966,933 | B1* | 5/2018 | Mauer | H03H 17/0248 |
| 2011/0282924 | A1* | 11/2011 | Mallinson | H03H 15/00 |
| | | | | 327/356 |
| 2016/0142042 | A1* | 5/2016 | Kamal | H03H 17/0227 |
| | | | | 708/190 |
| 2017/0201236 | A1* | 7/2017 | Kajita | H03M 3/02 |
| 2020/0177166 | A1* | 6/2020 | Quitzk | H03H 17/0225 |

* cited by examiner

*Primary Examiner* — Tuan T Lam
(74) *Attorney, Agent, or Firm* — Yee & Associates, P.C.

(57) ABSTRACT

A method and apparatus for generating a frequency comb. A sine wave comprising samples is generated at a selected sampling rate and a selected increment corresponding to a number of samples for a period of the sine wave using a lookup table or a CORDIC algorithm. The sine wave is processed by a universal differential equation to generate the frequency comb. Characteristics of the frequency comb generated from the sine wave are controlled by changing the sampling rate and the increment.

20 Claims, 12 Drawing Sheets

VARIABLE FREQUENCY COMB GENERATION

CROSS-REFERENCE TO RELATED APPLICATION

This application claims the benefit of U.S. Provisional Patent Application Ser. No. 63/133,550, filed Jan. 4, 2021, and entitled "Variable Frequency Comb Generation;" which is incorporated herein by reference in its entirety.

BACKGROUND INFORMATION

1. Field

The present disclosure relates generally to frequency combs and to systems and methods for generating frequency combs.

2. Background

A frequency comb is a signal that includes a series of discrete, equally spaced frequencies. A frequency comb is defined by three characteristics: starting frequency, frequency spacing, and number of frequencies. The starting frequency is the frequency of the "tooth" in the frequency comb that has the lowest frequency. The frequency spacing is the difference in frequency between adjacent "teeth" in the frequency comb. The number of frequencies is the number of "teeth" in the frequency comb.

Frequency combs have various applications. Examples of applications for frequency combs include, without limitation, wide band signal generation for phased arrays, geolocation of signals, probing signal generation, signal propagation measurement, and radio frequency signal characterization and test measurement. Wide band signal generation using frequency combs may be applied to software defined radio systems, satellite and ground communications systems, radar systems, and other appropriate systems and applications.

Frequency combs can be generated in various different ways. For relatively high frequency applications, such as optics, frequency combs typically may be generated in an analog fashion using nonlinear devices. For example, frequency combs may be generated by periodically modulating a continuous-wave laser in amplitude, phase, or both amplitude and phase. Other known methods for generating frequency combs include four-wave mixing in nonlinear media and stabilization of the pulse train generated by a mode-locked laser. These methods for generating frequency combs for relatively high frequency applications are relatively complex and may not be appropriate for generating frequency combs for relatively lower frequency applications, such as radio frequency applications.

Alternatively, frequency combs currently may be generated digitally using lookup tables or CORDIC algorithms implemented in hardware. CORDIC, coordinate rotation digital computer, uses relatively simple shift-add operations for computing tasks, such as the calculation of trigonometric functions and many others. Currently, such methods for generating frequency combs digitally require one lookup table or CORDIC algorithm implementation for each frequency "tooth" of the comb. Existing solutions for generating a frequency comb digitally thus require summing up results from many lookup tables or CORDIC algorithms to generate frequency combs of variable sizes.

Systems and methods for generating frequency combs that overcome the limitations of current systems and methods are desired. In particular, systems and methods are desired for generating frequency combs digitally that are more flexible and simple to implement than current systems and methods.

SUMMARY

Illustrative embodiments provide a method of generating a frequency comb. A sine wave is generated. The sine wave is processed by a universal differential equation to generate the frequency comb.

Illustrative embodiments also provide a method of generating a frequency comb by selecting a sampling rate and an increment. A sine wave is generated comprising samples at the selected sampling rate and the selected increment corresponding to a number of samples for a period of the sine wave. The sine wave is processed to generate the frequency comb. A starting frequency in the frequency comb is a function of the selected sampling rate and the selected increment. A number of frequencies in the frequency comb is a function of the selected increment. A frequency spacing of the frequencies in the frequency comb is a function of the selected sampling rate and the selected increment.

Illustrative embodiments also provide an apparatus for generating a frequency comb comprising a sine wave generator and a universal digital filter. The sine wave generator is configured to generate a sine wave. The universal digital filter is configured to process the sine wave using a universal differential equation to generate the frequency comb.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives, and features thereof, will best be understood by reference to the following detailed description of an illustrative embodiment when read in conjunction with the accompanying drawings, wherein:

DETAILED DESCRIPTION

Figure 1:
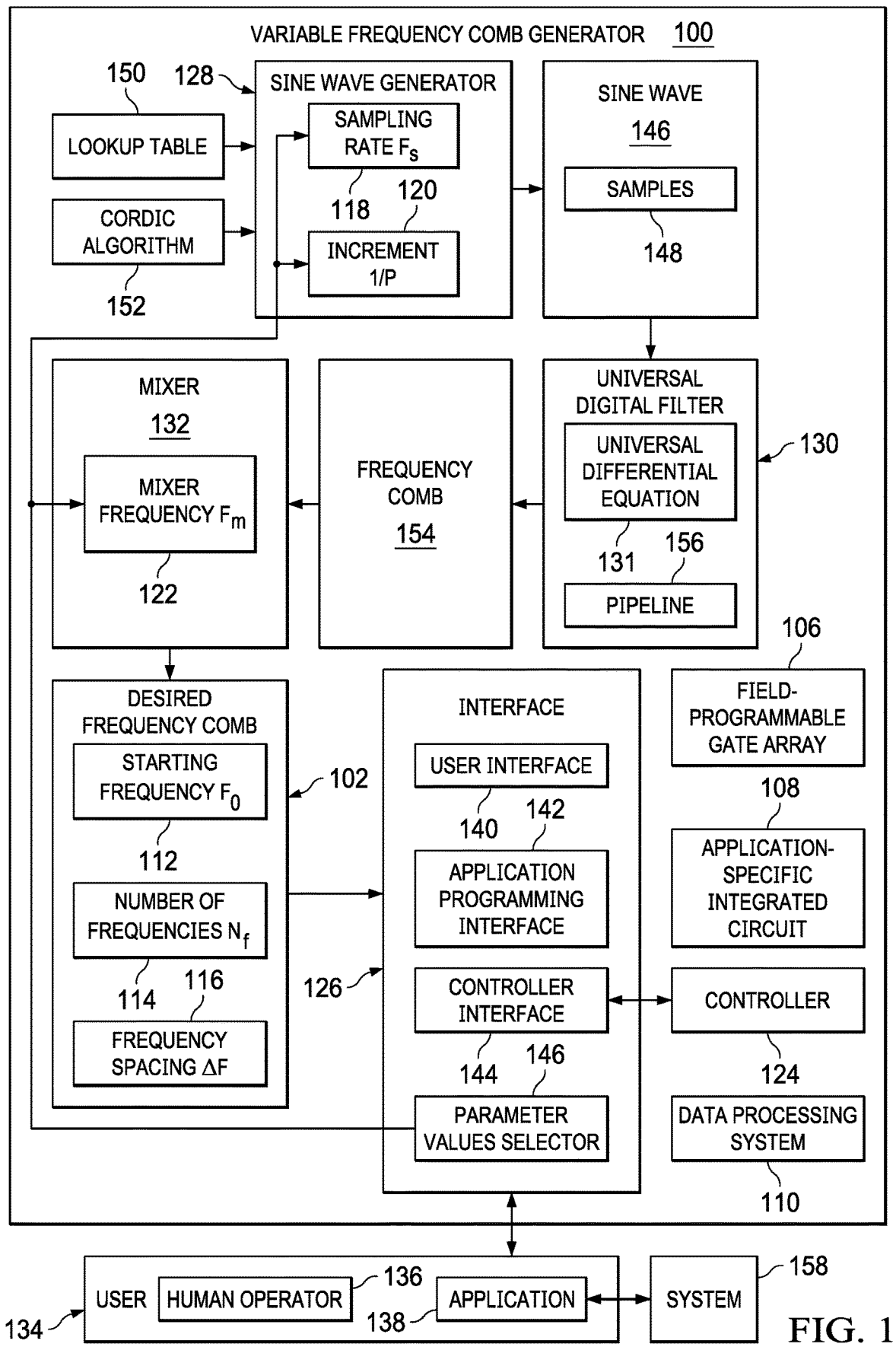
FIG. 1 is an illustration of a block diagram of a variable frequency comb generator in accordance with an illustrative embodiment.

The illustrative embodiments recognize and take into account different considerations. For example, the illustrative embodiments recognize and take into account that currently there are various applications for frequency combs and various ways to generate frequency combs. Generating frequency combs digitally may be appropriate for relatively lower frequency applications, such as radio frequency applications. However, current methods for generating frequency combs digitally are relatively complex and inflexible.

Current methods for generating frequency combs digitally require the implementation of one lookup table or CORDIC algorithm for each frequency of the comb. Therefore, the implementation of a system for digitally generating a typical frequency comb that has many frequencies may be relatively complex and time consuming. Furthermore, current systems for digitally generating frequency combs may require more hardware or other processing resources to generate frequency combs with more frequencies. Moreover, a current system for digitally generating a frequency comb that is defined by a particular starting frequency, frequency spacing, and number of frequency parameters may not be used to generate a frequency comb having different characteristics without modifying or replacing the lookup tables or CORDIC algorithms that are used by the system to generate the frequency comb. Therefore, current systems and methods for digitally generating frequency combs also are inflexible.

Illustrative embodiments provide a variable frequency comb generator that uses a single lookup table or CORDIC algorithm in combination with a nonlinear filter to generate a frequency comb. In accordance with an illustrative embodiment, the lookup table or CORDIC algorithm is used to generate a sine wave that is processed by the filter using a universal differential equation to generate a frequency comb with a desired number of frequencies and frequency spacing. The filter may implement the universal differential equation using relatively simple digital circuitry. Therefore, a variable frequency comb generator in accordance with an illustrative embodiment may be physically smaller and simpler to implement than current frequency comb generators.

A frequency comb generated in accordance with an illustrative embodiment has constant amplitude tones that cover a desired frequency range. Characteristics of a frequency comb generated in accordance with an illustrative embodiment may be controlled by selecting the sample rate and the table lookup or CORDIC algorithm increment used to generate the sine wave. By controlling these two parameters, along with a mixer frequency, a variable frequency comb generator in accordance with an illustrative embodiment may be used to generate a frequency comb having almost any desired characteristics, subject to the limitations of the sample rate of the circuit in which the variable frequency comb generator is implemented. Therefore, variable frequency comb generation in accordance with an illustrative embodiment may be more flexible than current systems and methods for frequency comb generation.

Turning to FIG. 1, an illustration of a block diagram of a variable frequency comb generator is depicted in accordance with an illustrative embodiment. Variable frequency comb generator 100 is configured to generate desired frequency comb 102.

Variable frequency comb generator 100 may be implemented to generate desired frequency comb 102 using digital hardware, analog hardware, or an appropriate combination of digital and analog hardware. Variable frequency comb generator 100 that is implemented to generate desired frequency comb 102 digitally may be referred to as a variable digital frequency comb generator.

It may be necessary or desirable to convert desired frequency comb 102 that is generated digitally into an analog frequency comb signal or to convert desired frequency comb 102 that is generated as an analog signal into an appropriate digital form for use. Such a conversion from digital to analog or from analog to digital may be needed to use desired frequency comb 102 generated by variable frequency comb generator 100 for a particular purpose or for any other appropriate reason. For example, without limitation, a digital-to-analog converter (not shown in FIG. 1) or other appropriate device or method may be used to convert desired frequency comb 102 that is generated digitally by variable frequency comb generator 100 into an analog frequency comb signal for use.

The functionality of variable frequency comb generator 100 as described herein may be implemented in any appropriate manner. For example, without limitation, the functionality of variable frequency comb generator 100 to generate desired frequency comb 102 digitally may be implemented using digital hardware devices or systems such as field-programmable gate array 106, application-specific integrated circuit 108, data processing system 110, other appropriate hardware devices or systems, or any appropriate combination of hardware devices and systems. For example, without limitation, some or all of the functionality of variable frequency comb generator 100 as described herein may be implemented in software running on data processing system 110.

Desired frequency comb 102 is a signal that comprises a series of discrete, equally spaced frequencies. The frequencies comprising desired frequency comb 102 may include frequencies in any appropriate ranges of frequencies. For example, without limitation, the frequencies comprising desired frequency comb 102 may include optical frequencies, radio frequencies, acoustic frequencies, frequencies in other ranges of frequencies, or frequencies in more than one range of frequencies.

The time domain representation of desired frequency comb 102 is:

$$s(t) = \sum_{j=0}^{Nf} \sin(2\pi t f_j), \quad (1)$$

where the sum is over the frequencies in the comb, $f_j$. The frequencies are evenly spaced and given by:

$$f_j = f_0 + j\Delta f. \quad (2)$$

Desired frequency comb 102 is thus defined by three characteristics: starting frequency $F_0$ 112, number of frequencies $N_f$ 114, and frequency spacing $\Delta F$ 116. Starting frequency $F_0$ 112 is the frequency of the "tooth" in desired frequency comb 102 that has the lowest frequency. Number of frequencies $N_f$ 114 is the number of "teeth" in desired frequency comb 102. Frequency spacing $\Delta F$ 116 is the difference in frequency between adjacent "teeth" in desired frequency comb 102.

In accordance with an illustrative embodiment, desired frequency comb 102 having desired values for characteristics 112, 114, and 116 may be generated by variable frequency comb generator 100 by selecting appropriate values for three parameters: sampling rate $F_s$ 118, increment 1/P 120, and mixer frequency $F_m$ 122. Variable frequency comb generator 100 thus may be used to generate desired frequency combs 102 having various different characteristics 112, 114, and 116 by selecting various different appropriate values for parameters 118, 120, and 122. The use and selection of appropriate parameters 118, 120, and 122 for generating desired frequency comb 102 by variable frequency comb generator 100 is described in more detail below.

Variable frequency comb generator 100 may comprise controller 124, interface 126, sine wave generator 128, universal digital filter 130, and mixer 132. Controller 124 may be configured to control general operation of variable frequency comb generator 100. For example, without limitation, controller 124 may be configured to control the starting and stopping of other components of variable frequency comb generator 100 to generate desired frequency comb 102.

Interface 126 may be configured to provide for interaction between variable frequency comb generator 100 and user 134. User 134 may be any appropriate user of variable frequency comb generator 100. For example, user 134 may be human operator 136, application 138 implemented on a machine, or both.

Interface 126 may include user interface 140 to provide for interaction between human operator 136 and variable frequency comb generator 100. User interface 140 may be implemented in any appropriate manner to provide for interaction between human operator 136 and variable frequency comb generator 100. For example, without limitation, user interface 140 may comprise a graphical user interface. Alternatively, or in addition, interface 126 may include application programming interface 142, or any other appropriate interface, to provide for interaction between application 138 on a machine and variable frequency comb generator 100.

Desired frequency comb 102 generated by variable frequency comb generator 100 may be provided to user 134 via interface 126 in any appropriate form. Other functionality provided by interface 126 may include, without limitation, controller interface 144 and parameter values selector 146. For example, controller interface 144 may be configured to allow user 134 to control, view, or both control and view the general operation of variable frequency comb generator 100 by controller 124.

Parameter values selector 146 may be configured to allow user 134 to select the values of parameters 118, 120, and 122 to be used by variable frequency comb generator 100 to generate desired frequency comb 102. Parameter values selector 146 may be configured to allow user 134 to select the values of parameters 118, 120, and 122 directly. Alternatively, or in addition, parameter values selector 146 may be configured to allow user 134 to select values for characteristics 112, 114, and 116 of desired frequency comb 102 to be generated by variable frequency comb generator 100. In this case, values for parameters 118, 120, and 122 needed to generate desired frequency comb 102 having the selected characteristics 112, 114, and 116 may be determined automatically by variable frequency comb generator 100.

In accordance with an illustrative embodiment, desired frequency comb 102 is generated using sine wave generator 128, universal digital filter 130, and mixer 132.

Sine wave generator 128 is configured to generate sine wave 146 using the selected values for the parameters sampling rate $F_s$ 118 and increment 1/P 120. Sine wave 146 generated by sine wave generator 128 comprises samples 148. Samples 148 comprise values for sine wave 146 at discrete points in time. For example, without limitation, sine wave generator 128 may be configured to generate sine wave 146 using lookup table 150 or CORDIC algorithm 152.

Lookup table 150 comprises values for one cycle of a sine wave at many discrete points in the cycle. Sine wave generator 128 may generate sine wave 146 by obtaining values for samples 148 defining sine wave 146 from lookup table 150 at sampling rate $F_s$ 118 and increment 1/P 120. Increment 1/P 120 is inversely related to the period P of sine wave 146 and determines the number of values for samples 148 that are obtained from lookup table 150 for an entire period P of sine wave 146. The number of values for samples 148 that are obtained from lookup table 150 for a period P of sine wave 146 will be relatively large when the value of increment 1/P 120 is relatively small and will be relatively small when the value of increment 1/P 120 is relatively large.

CORDIC algorithm 152 uses relatively simple shift-add operations to calculate values of trigonometric functions, such as sine waves. CORDIC algorithm 152 may be implemented in any appropriate manner in variable frequency comb generator 100. Sine wave generator 128 may generate sine wave 146 by obtaining values for samples 148 defining sine wave 146 using CORDIC algorithm 152 at sampling rate $F_s$ 118 and increment 1/P 120. Increment 1/P 120 is inversely related to the period P of sine wave 146 and determines the number of values for samples 148 that are obtained using CORDIC algorithm 152 for an entire period P of sine wave 146. Increment 1/P 120 may be referred to as a step in CORDIC algorithm 152 used to generate samples 148 for sine wave 146.

Universal digital filter 130 is configured to process sine wave 146 to generate frequency comb 154. The filter function of universal digital filter 130 is selected to generate frequency comb 154 from sine wave 146 for sine waves of certain frequencies. In accordance with an illustrative embodiment, discretized universal differential equation 131 may be used to implement a digital difference equation that forms nonlinear universal digital filter 130.

For example, without limitation, universal digital filter 130 may be configured to implement the following universal differential equation filter function to generate frequency comb 154 from sine wave 146 for sine waves of certain frequencies:

$$z_i=(3y3 \cdot y2 \cdot y1-2(1-n^{-2}) \cdot y2^3)/y1^2-y_1+4y_2-6y_3+4y_4, \quad (3)$$

wherein:

$$y1=-11/6 \cdot y_1+3y_2-3/2 \cdot y_3+\tfrac{1}{3} \cdot y_4, \quad (4)$$

$$y2=2y_1-5y_2+4y_3-y_4, \text{ and} \quad (5)$$

$$y3=-y_1+3y_2-3y_3+y_4. \quad (6)$$

$z_i$ is the value of the output of universal digital filter 130 for point in time i. $y_1$, $y_2$, $y_3$, and $y_4$ are the values of sequential samples 148 of sine wave 146 input to universal digital filter 130 for points i−3, i−2, i−1, and i, respectively. $y_1$, $y_2$, $y_3$, and $y_4$ also may be expressed as $y_{i-3}$, $y_{i-2}$, $y_{i-1}$, and $y_i$, respectively.

Examples of combinations of values that may be used to select values for the parameters sampling rate $F_s$ 118 and increment 1/P 120 to generate sine wave 146 from which universal digital filter 130 implementing this filter function generates frequency comb 154 are shown in the following table:

| Period P | $N_f$ | $f_0$ | Δf | var(spectral peaks) |
|---|---|---|---|---|
| 8 | 2 | 0.1251 | 0.25 | 0.000885979 |
| 16 | 4 | 0.0626 | 0.125 | 0.000247679 |
| 20 | 5 | 0.0501 | 0.1 | 0.000381461 |
| 32 | 8 | 0.0313 | 0.0626 | 0.000391865 |
| 40 | 10 | 0.0251 | 0.05 | 0.000279433 |
| 64 | 16 | 0.0157 | 0.0313 | 9.83E−05 |
| 80 | 20 | 0.0126 | 0.025 | 5.47E−05 |
| 100 | 25 | 0.0101 | 0.02 | 2.96E−05 |
| 160 | 40 | 0.0063 | 0.0125 | 7.73E−06 |
| 200 | 50 | 0.0051 | 0.01 | 3.98E−06 |
| 320 | 80 | 0.0032 | 0.0063 | 9.97E−07 |
| 400 | 100 | 0.0026 | 0.005 | 5.07E−07 |
| 500 | 125 | 0.0021 | 0.004 | 2.60E−07 |
| 800 | 200 | 0.0013 | 0.0025 | 6.62E−08 |
| 1000 | 250 | 0.0011 | 0.002 | 3.26E−08 |
| 1600 | 400 | 0.0007 | 0.0013 | 8.46E−09 |
| 2000 | 500 | 0.0006 | 0.001 | 4.08E−09 |
| 2500 | 625 | 0.0005 | 0.0008 | 2.09E−09 |
| 4000 | 1000 | 0.0003 | 0.0005 | 6.11E−10 |
| 5000 | 1250 | 0.0003 | 0.0004 | 2.61E−10 |
| 8000 | 1999 | 0.0002 | 0.0003 | 8.61E−11 |
| 10000 | 2499 | 0.0002 | 0.0002 | 3.21E−11 |

In this table:

Period P is the period of the starting frequency $f_0$ of frequency comb 154, expressed as a number of samples 148 for the given sampling rate $F_s$ 118 for an entire period P of sine wave 146. As discussed above, the value of period P defines increment 1/P 120 used for generating sine wave 146 from lookup table 150 or CORDIC algorithm 152.

$N_f$ is the number of frequencies in frequency comb 154 and in desired frequency comb 102.

$f_0$ is the lowest frequency in frequency comb 154, expressed relative to sampling rate $F_s$ 118.

Δf is the frequency spacing in frequency comb 154, expressed relative to sampling rate $F_s$ 118.

var(spectral peaks) is the variance of the spectral peaks in frequency comb 154. This is a measure of the numerical performance of the algorithm for generating frequency comb 154 as well as the performance of universal digital filter 130 in generating frequency comb 154.

The table shows only a sample of possible combinations of values that may be used to select values for the parameters sampling rate $F_s$ 118 and increment 1/P 120 to generate sine wave 146 from which universal digital filter 130 generates frequency comb 154. Many more combinations of values are possible that are not shown in the table, even within the ranges of values shown in the table. Such other appropriate values may be determined using fractional periods and may require appropriate adjustments in lookup table 150 or CORDIC algorithm 152 used to generate sine wave 146.

Universal digital filter 130 may be implemented in any appropriate manner to implement universal differential equation 131. For example, without limitation, universal digital filter 130 may be implemented in pipeline 156. In pipeline 156, data processing elements are connected in series, such that the output of one element is provided as the input to the next element in the series. The elements may then be operated in parallel.

Desired frequency comb 102 may be generated from frequency comb 154 generated by universal digital filter 130 from sine wave 146 by processing frequency comb 154 by mixer 132 to convert the frequencies in frequency comb 154 upward or downward by the value of mixer frequency $F_m$ 122. Mixer 132 may be implemented in any known and appropriate manner.

Desired frequency comb 102 having desired values for the characteristics starting frequency $F_0$ 112, number of frequencies $N_f$ 114, and frequency spacing ΔF 116, may be generated by variable frequency comb generator 100 by selecting appropriate values for the parameters sampling rate $F_s$ 118, increment 1/P 120, and mixer frequency $F_m$ 122. For example, to generate desired frequency comb 102 with each frequency $F_j$ in a desired number of frequencies $N_f$ 114 given by $F_j=F_0+j\Delta F$, appropriate values for the parameters sampling rate $F_s$ 118, increment 1/P 120, and mixer frequency $F_m$ 122 may be selected so that $F_0=F_m+F_s/P$ and $\Delta F=\Delta f \cdot F_s$ and the desired number of frequencies $N_f$ 114 match for a combination of values from the table presented above or another appropriate combination of values.

Desired frequency comb 102, generated by variable frequency comb generator 100 in accordance with an illustrative embodiment, may be used for any appropriate application 138 in any appropriate system 158. For example, without limitation, desired frequency comb 102 may be used in application 138 such as geolocation of signals, probing signal generation, propagation measurement and characterization, testing of radio frequency measurements, and other appropriate applications. For example, without limitation, desired frequency comb 102 may be used in system 158 such as software defined radio systems, satellite and ground communications systems, radar systems, and other appropriate systems. More detailed descriptions of some examples of applications of variable frequency comb generator 100 in accordance with an illustrative embodiment are presented below with reference to FIGS. 8-10 and FIGS. 12-14.

The illustration of variable frequency comb generator 100 in FIG. 1 is not meant to imply physical or architectural limitations to the manner in which illustrative embodiments may be implemented. Other components, in addition to or in place of the ones illustrated, may be used. Some components may be optional. Also, the blocks are presented to illustrate some functional components. One or more of these blocks may be combined, divided, or combined and divided into different blocks when implemented in an illustrative embodiment.

Figure 2:
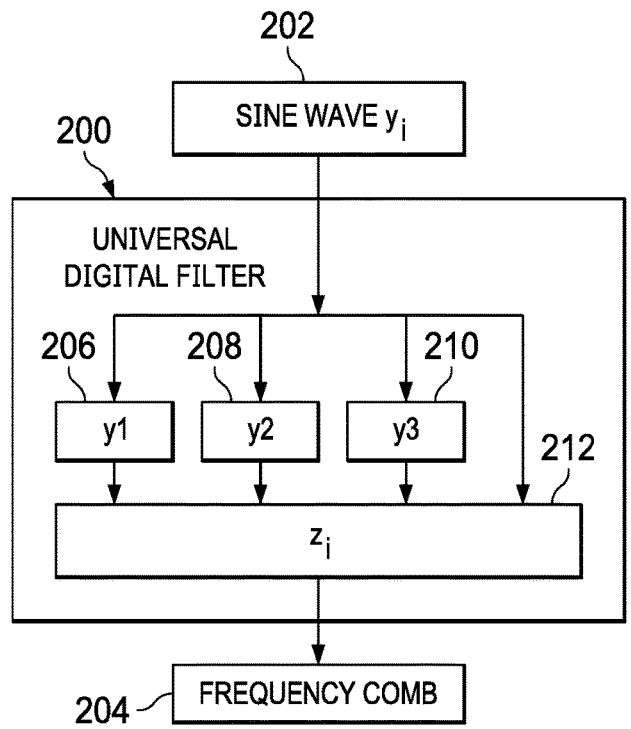
FIG. 2 is an illustration of a block diagram of an implementation of a universal digital filter in accordance with an illustrative embodiment.

Turning to FIG. 2, an illustration of a block diagram of an implementation of a universal digital filter is depicted in accordance with an illustrative embodiment. Universal digital filter 200 is an example of one implementation of universal digital filter 130 in variable frequency comb generator 100 in FIG. 1.

Universal digital filter 200 is configured to process input sine wave $y_i$ 202 using a universal differential equation to generate frequency comb 204. In this example, universal digital filter 200 is implemented in circuits 206, 208, 210, and 212. Circuit 206 is configured to implement equation 4 above. Circuit 208 is configured to implement equation 5 above. Circuit 210 is configured to implement equation 6 above. Circuit 212 is configured to implement equation 3 above. For example, without limitation, each of circuits 206, 208, 210, and 212 may be implemented as a pipeline circuit.

Figure 3:
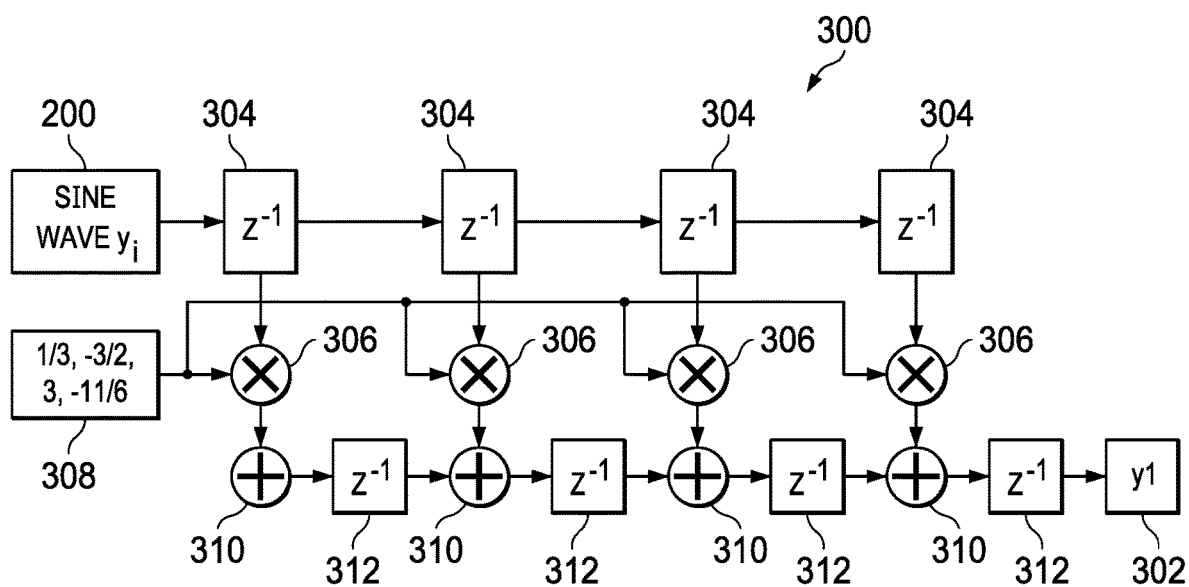
FIGS. 3-6 are illustrations of implementations of parts of a universal digital filter in accordance with an illustrative embodiment.
Figure 4:
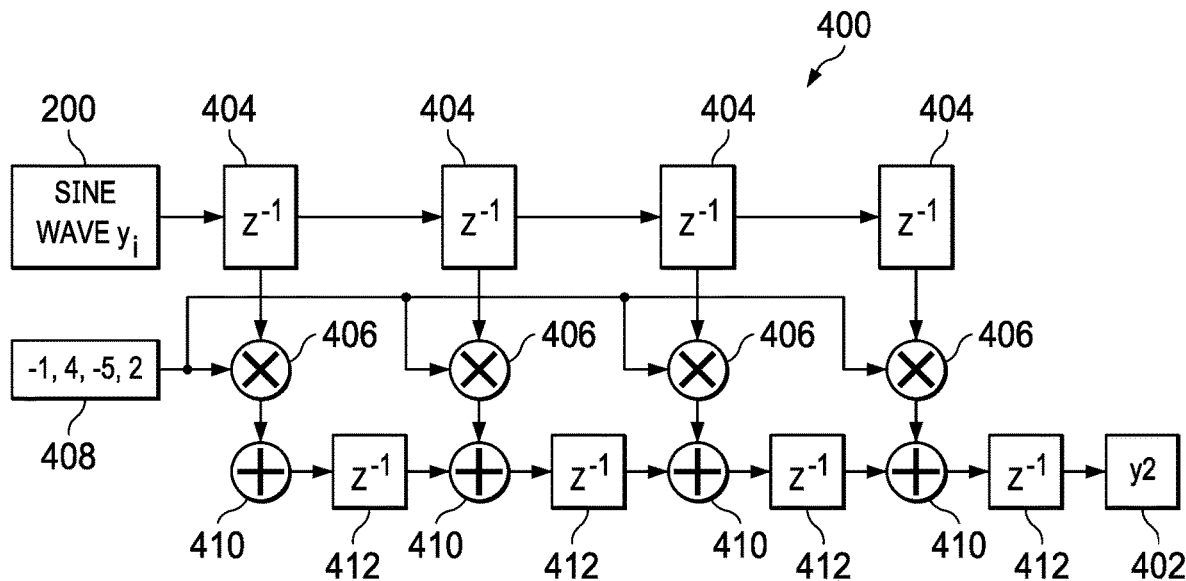
Figure 5:
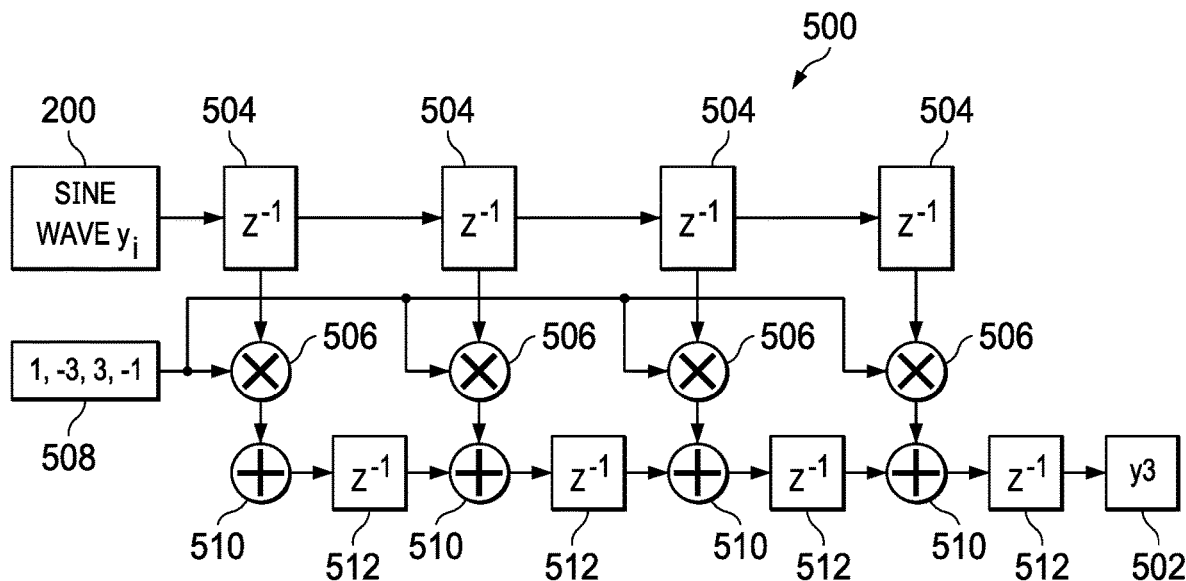
Figure 6:
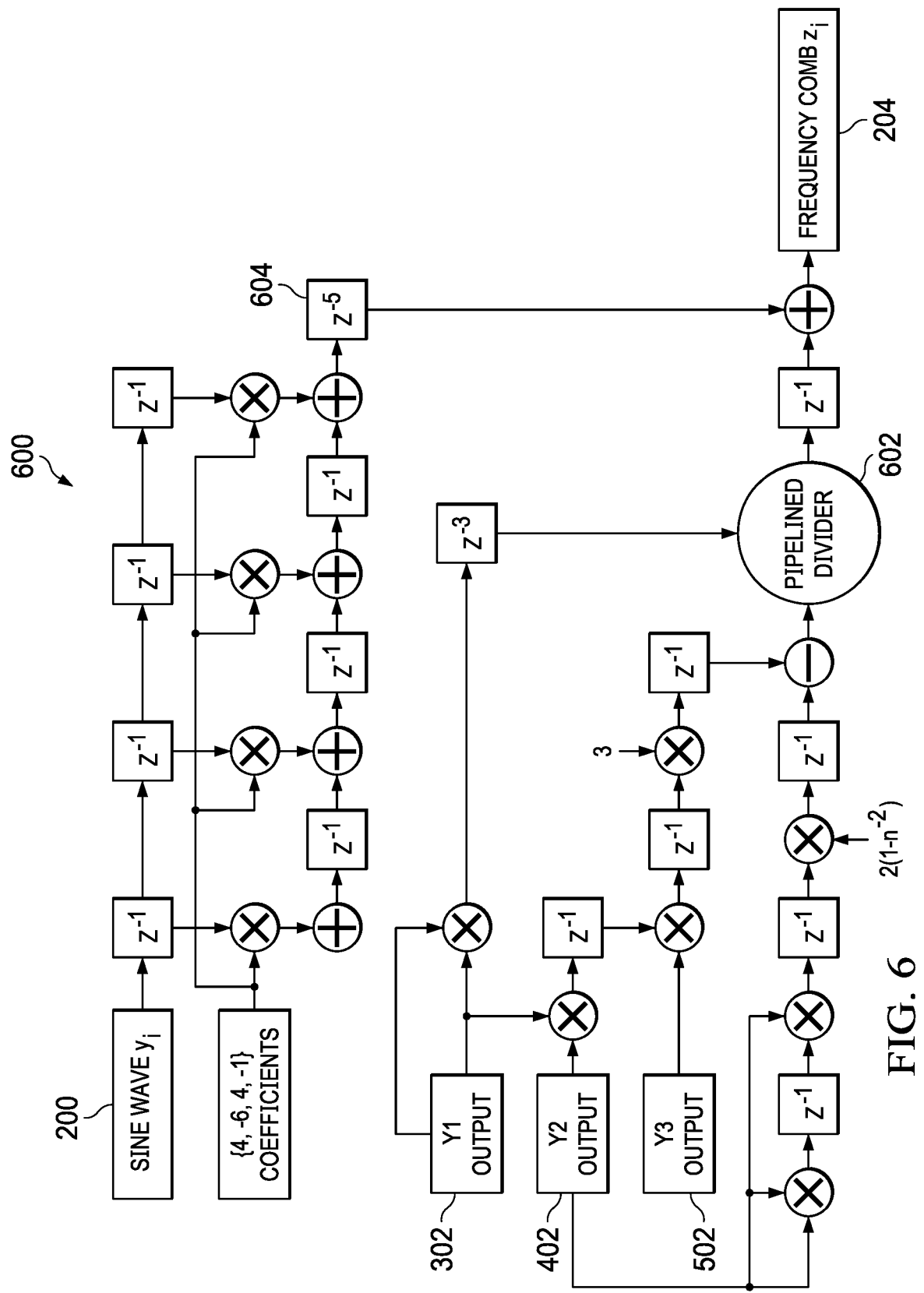

Turning to FIGS. 3-6, illustrations of implementations of parts of a universal digital filter are depicted in accordance with an illustrative embodiment. Circuit 300 in FIG. 3 is an example of one implementation of circuit 206 in universal digital filter 200 in FIG. 2. Circuit 400 in FIG. 4 is an example of one implementation of circuit 208 in universal digital filter 200 in FIG. 2. Circuit 500 in FIG. 5 is an example of one implementation of circuit 210 in universal digital filter 200 in FIG. 2. Circuit 600 in FIG. 6 is an example of one implementation of circuit 212 in universal digital filter 200 in FIG. 2. As shown in FIGS. 2-6, a universal digital filter for a variable frequency comb generator in accordance with an illustrative embodiment may be implemented with relatively simple digital circuits including a relatively small number of adders and multipliers and a single divider.

In circuits 300, 400, and 500, in FIGS. 3-5, equations 4-6 are implemented to compute outputs y1 302, y2 402, and y3 502, respectively, from input sine wave $y_i$ 202 in a pipelined fashion. At each cycle of a clock signal, a new sample of sine wave $y_i$ 202 is input to the first of a series of clocked registers 304, 404, 504, and the sample of input sine wave $y_i$ 202 that is currently held in each of clocked registers 304, 404, 504 is shifted into the next one of clocked registers 304, 404, 504, in the series. Also, at each clock cycle, the values of the input samples in clocked registers 304, 404, 504, are multiplied 306, 406, 506, by appropriate coefficients 308, 408, 508, for the equation being implemented, with the results added 310, 410, 510, with values stored in a series of clocked registers 312, 412, 512. The results of the additions 310, 410, 510 are stored in the next ones of clocked registers 312, 412, 512, in the series. The value in the last one of clocked registers 312, 412, 512, in the series is the output 302, 402, 502, of circuit 300, 400, 500 at the end of each clock cycle.

In circuit 600 in FIG. 6, equations 3 is implemented to compute output frequency comb $z_i$ 204 from input sine wave $y_i$ 202 and outputs y1 302, y2 402, and y3 502, from circuits 300, 400, and 500, in FIGS. 3-5, respectively, in a pipelined fashion. Circuit 600 includes pipelined divider 602. Pipelined divider 602 may be implemented using any appropriate standard pipelined divider circuit or other pipelined divider circuit. The delay provided by delay element 604 may be changed depending on the latency of pipelined divider 602. For example, delay element 604 may provide a delay of 5 clock cycles for a delay of one clock cycle by pipelined divider 602. The delay provided by delay element 604 may be increased by one clock cycle for each additional clock cycle of delay by pipelined divider 602.

Figure 7:
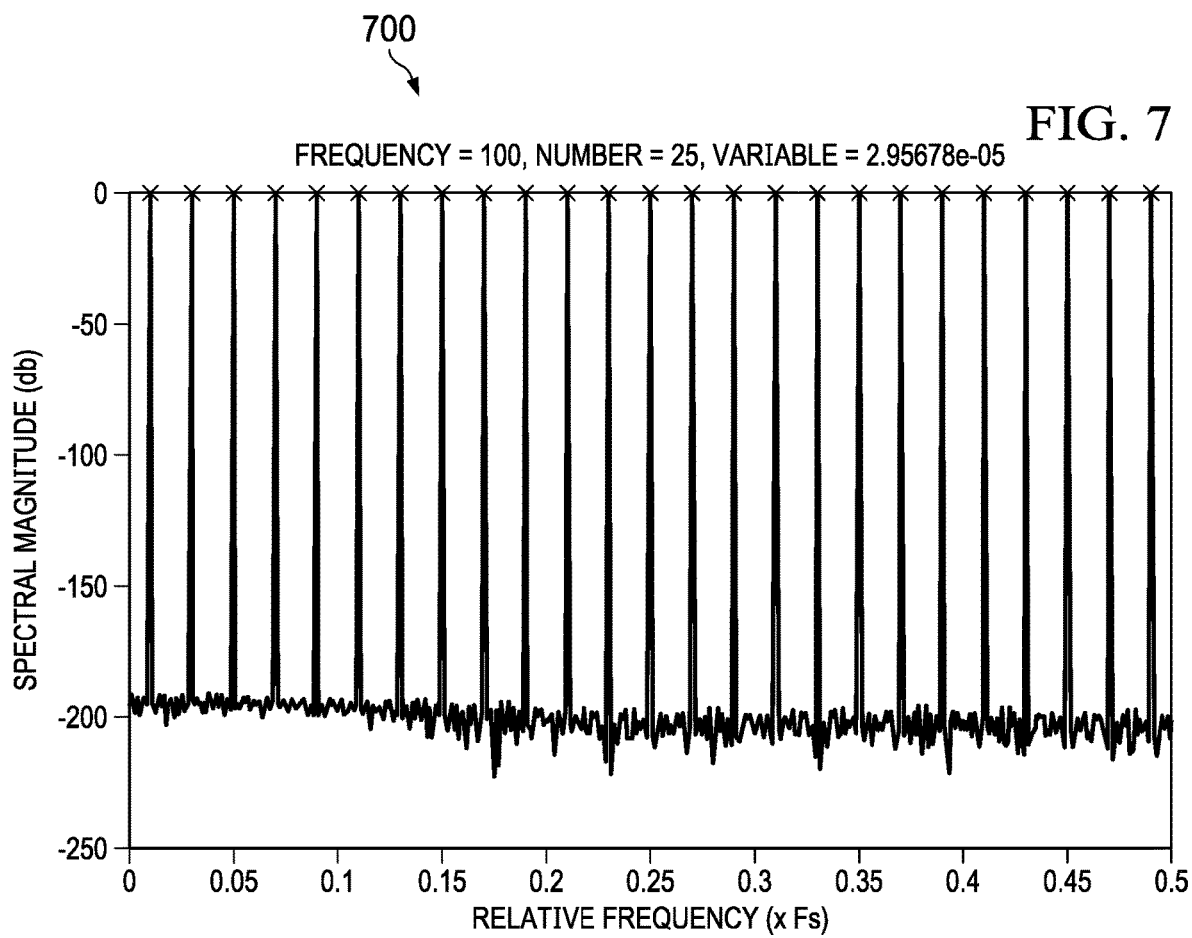
FIG. 7 is a frequency domain illustration of a frequency comb generated in accordance with an illustrative embodiment.

Turning to FIG. 7, a frequency domain illustration of a frequency comb generated in accordance with an illustrative embodiment is depicted. Frequency comb 700 was simulated using the method as described herein using P=100 from the table presented above. Frequency comb 700 illustrates that a complete frequency comb is generated up to the Nyquist rate of the system.

Figure 8:
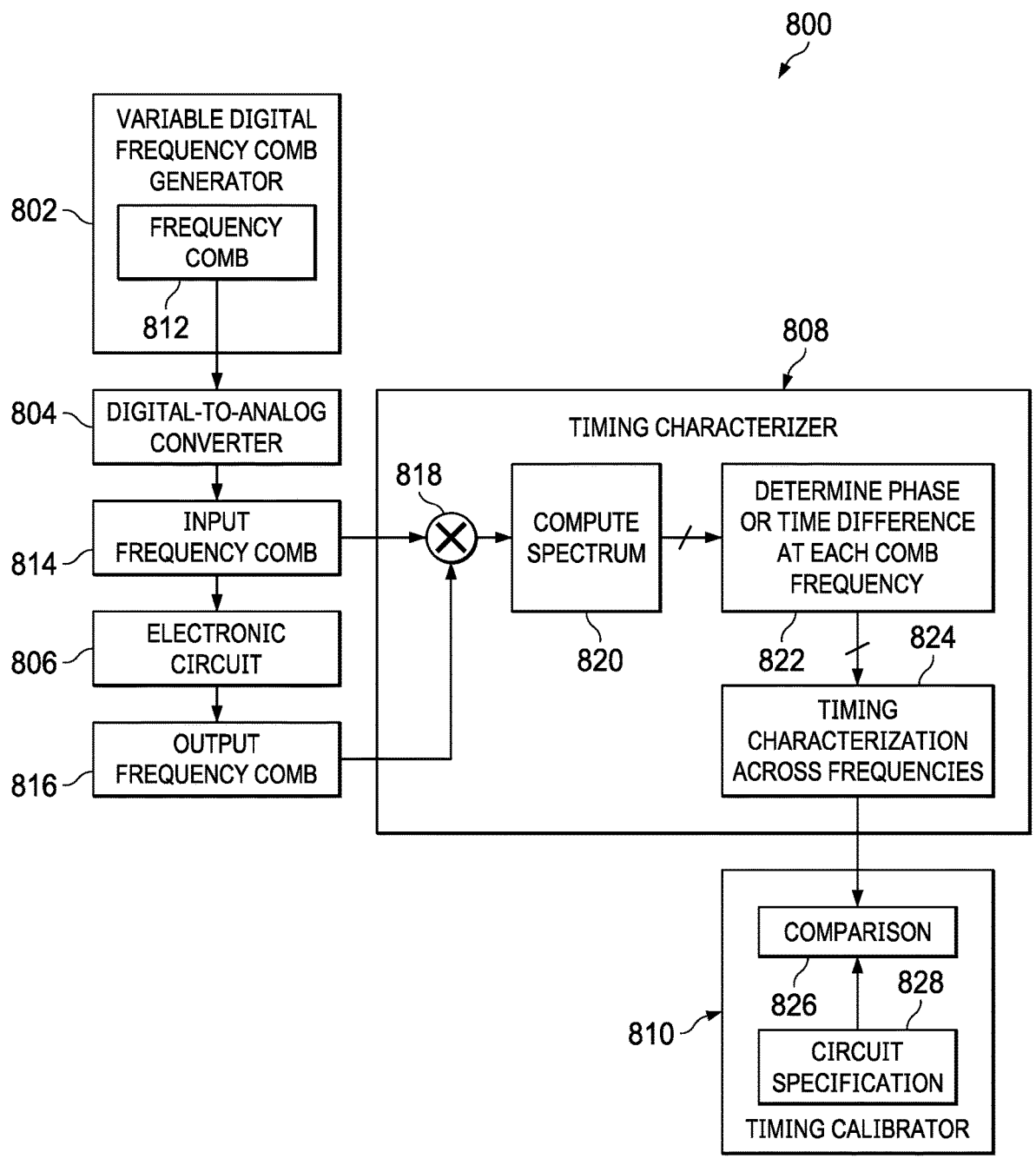
FIG. 8 is an illustration of a block diagram of an arrangement of components for performing timing calibration across frequencies of an electronic circuit using a variable digital frequency comb generator in accordance with an illustrative embodiment.

Turning to FIG. 8, an illustration of a block diagram of an arrangement of components for performing timing calibration across frequencies of an electronic circuit using a variable digital frequency comb generator is depicted in accordance with an illustrative embodiment. Arrangement of components 800 includes variable digital frequency comb generator 802, digital-to-analog converter 804, electronic circuit 806, timing characterizer 808, and timing calibrator 810. Variable frequency comb generator 100 in FIG. 1 is an example of one possible implementation of variable digital frequency comb generator 802.

In this example, variable digital frequency comb generator 802 may be implemented in digital hardware as described to generate frequency comb 812 as a digital signal. Digital frequency comb 812 is converted by digital-to-analog converter 804 to an analog input frequency comb 814 signal which can then be injected into a specific input point of electronic circuit 806 under test. This allows measurement of the time delay through electronic circuit 806 at all comb frequencies of input frequency comb 814 simultaneously.

Timing characterizer 808 is configured to compare the delay at the various comb frequencies between input frequency comb 814 and the resulting output frequency comb 816 produced by electronic circuit 806 in response to input frequency comb 814. Timing characterizer 808 is configured to perform this comparison by complex conjugate mixing 818 of input frequency comb 814 and output frequency comb 816, computing the spectrum 820 of the result of complex conjugate mixing 818, and then measuring a phase or time difference at each comb frequency 822 from the computed spectrum. The result is timing characterization across frequencies 824 of electronic circuit 806.

Timing calibrator 810 may be configured to perform comparison 826 of timing characterization across frequencies 824 for electronic circuit 806 under test to circuit specification 828 for electronic circuit 806.

Figure 9:
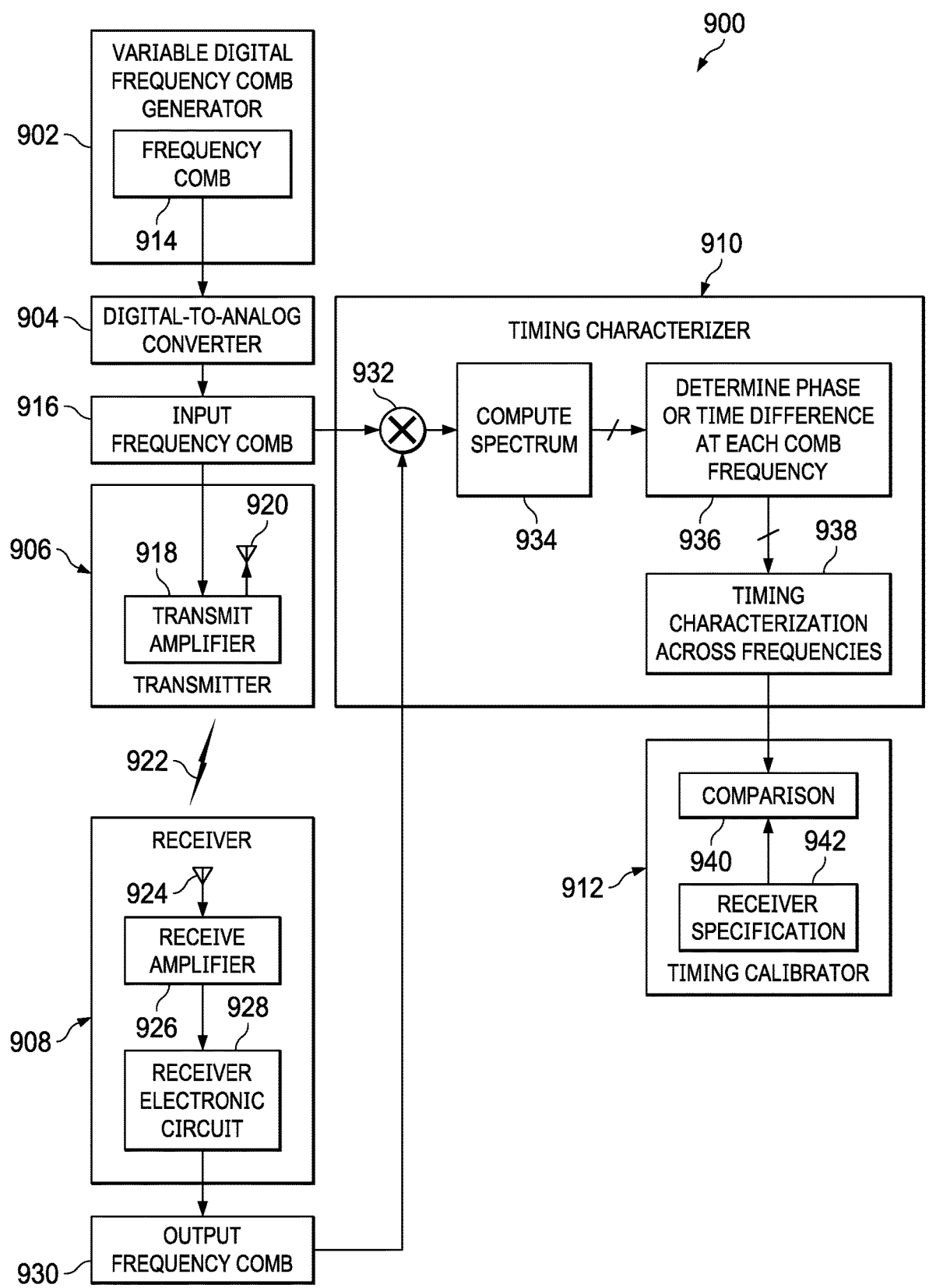
FIG. 9 is an illustration of a block diagram of an arrangement of components for performing timing calibration across frequencies of a receiver using a variable digital frequency comb generator in accordance with an illustrative embodiment.

Turning to FIG. 9, an illustration of a block diagram of an arrangement of components for performing timing calibration across frequencies of a receiver using a variable digital frequency comb generator is depicted in accordance with an illustrative embodiment. In this example, a variable frequency comb generator in accordance with an illustrative embodiment is used as a broadcast signal source to test a full receiver including an antenna. Arrangement of components 900 includes variable digital frequency comb generator 902, digital-to-analog converter 904, transmitter 906, receiver 908, timing characterizer 910, and timing calibrator 912. Variable frequency comb generator 100 in FIG. 1 is an example of one possible implementation of variable digital frequency comb generator 902.

In this example, variable digital frequency comb generator 902 may be implemented in digital hardware as described to generate frequency comb 914 as a digital signal. Digital frequency comb 914 is converted by digital-to-analog converter 904 to an analog input frequency comb 916 signal. Analog input frequency comb 916 is provided to transmitter 906. Transmitter 906 includes transmit amplifier 918 and transmit antenna 920 for transmitting input frequency comb 916 as transmission 922.

Receiver 908 includes receive antenna 924 and receive amplifier 926 for receiving transmission 922 of input frequency comb 916. The received signal is processed by receiver electronic circuit 928.

Timing characterizer 910 is configured to compare the delay at the various comb frequencies between input frequency comb 916 and the resulting output frequency comb 930 produced by receiver 908 in response to input frequency comb 916. Timing characterizer 910 is configured to perform this comparison by complex conjugate mixing 932 of input frequency comb 916 and output frequency comb 930, computing the spectrum 934 of the result of complex conjugate mixing 932, and then measuring a phase or time difference at each comb frequency 936 from the computed spectrum. The result is timing characterization across frequencies 938 of receiver 908.

Timing calibrator 912 may be configured to perform comparison 940 of timing characterization across frequencies 938 for receiver 908 to receiver specification 942 for receiver 908.

Figure 10:
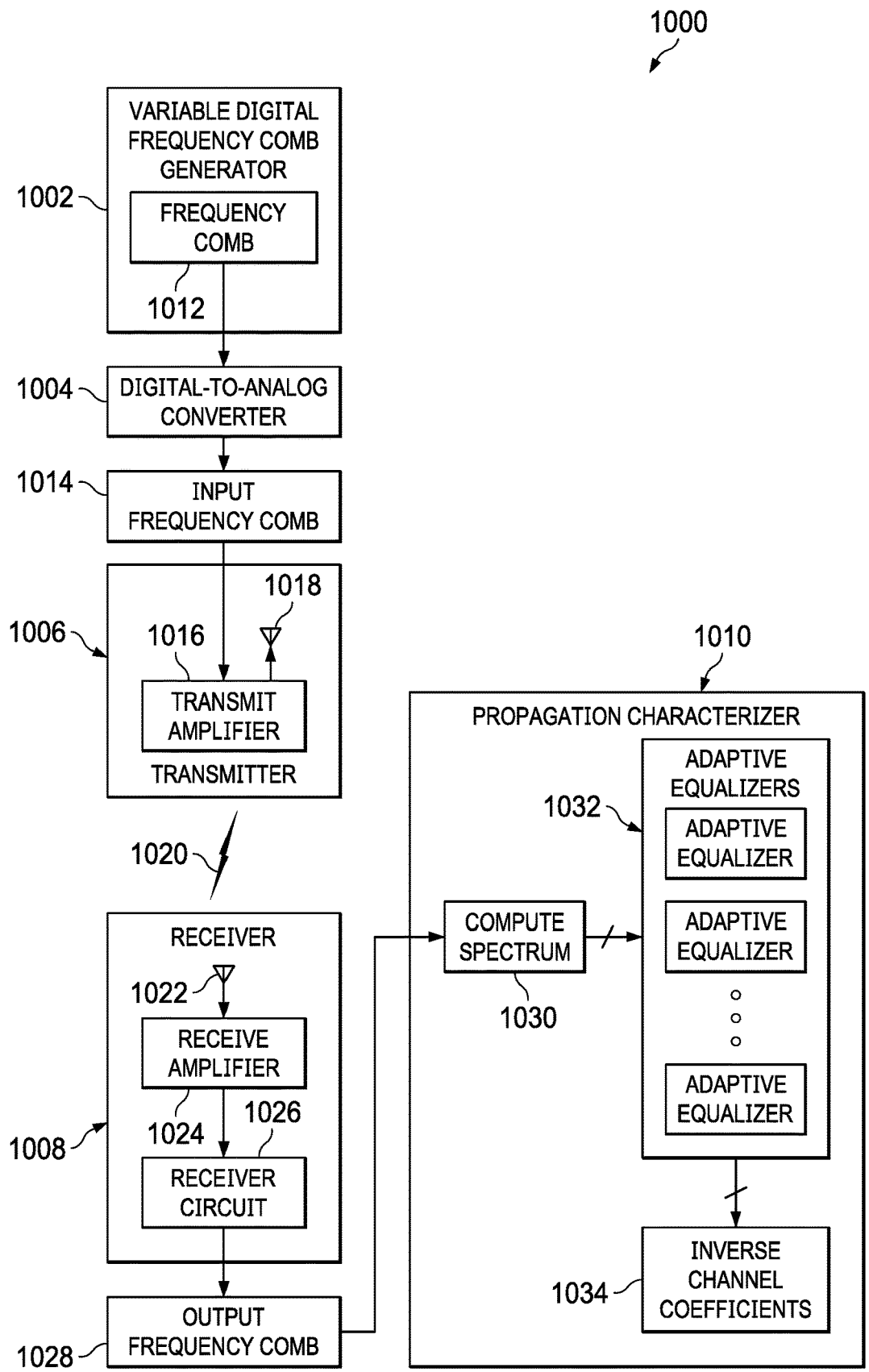
FIG. 10 is an illustration of a block diagram of an arrangement of components for performing propagation measurement of a receiver using a variable digital frequency comb generator in accordance with an illustrative embodiment.

Turning to FIG. 10, an illustration of a block diagram of an arrangement of components for performing propagation measurement of a receiver using a variable digital frequency comb generator is depicted in accordance with an illustrative embodiment. In this example, a variable frequency comb generator in accordance with an illustrative embodiment can provide simultaneous propagation measurements that include channel characterization over time. Arrangement of components 1000 includes variable digital frequency comb generator 1002, digital-to-analog converter 1004, transmitter 1006, receiver 1008, and propagation characterizer 1010. Variable frequency comb generator 100 in FIG. 1 is an example of one possible implementation of variable digital frequency comb generator 1002.

In this example, variable digital frequency comb generator 1002 may be implemented in digital hardware as described to generate frequency comb 1012 as a digital signal. Digital frequency comb 1012 is converted by digital-to-analog converter 1004 to an analog input frequency comb 1014 signal. Analog input frequency comb 1014 is provided to transmitter 1006. Transmitter 1006 includes transmit amplifier 1016 and transmit antenna 1018 for transmitting input frequency comb 1014 as transmission 1020.

Receiver 1008 includes receive antenna 1022 and receive amplifier 1024 for receiving transmission 1020 of input frequency comb 1014. The received signal is processed by receiver electronic circuit 1026 to generate output frequency comb 1028.

Propagation characterizer 1010 is configured to compute the spectrum 1030 of output frequency comb 1028. Set of adaptive equalizers 1032, or their equivalent, process the computed spectrum to provide inverse channel coefficients 1034 at each point in time for each comb frequency.

Figures 11, 12:
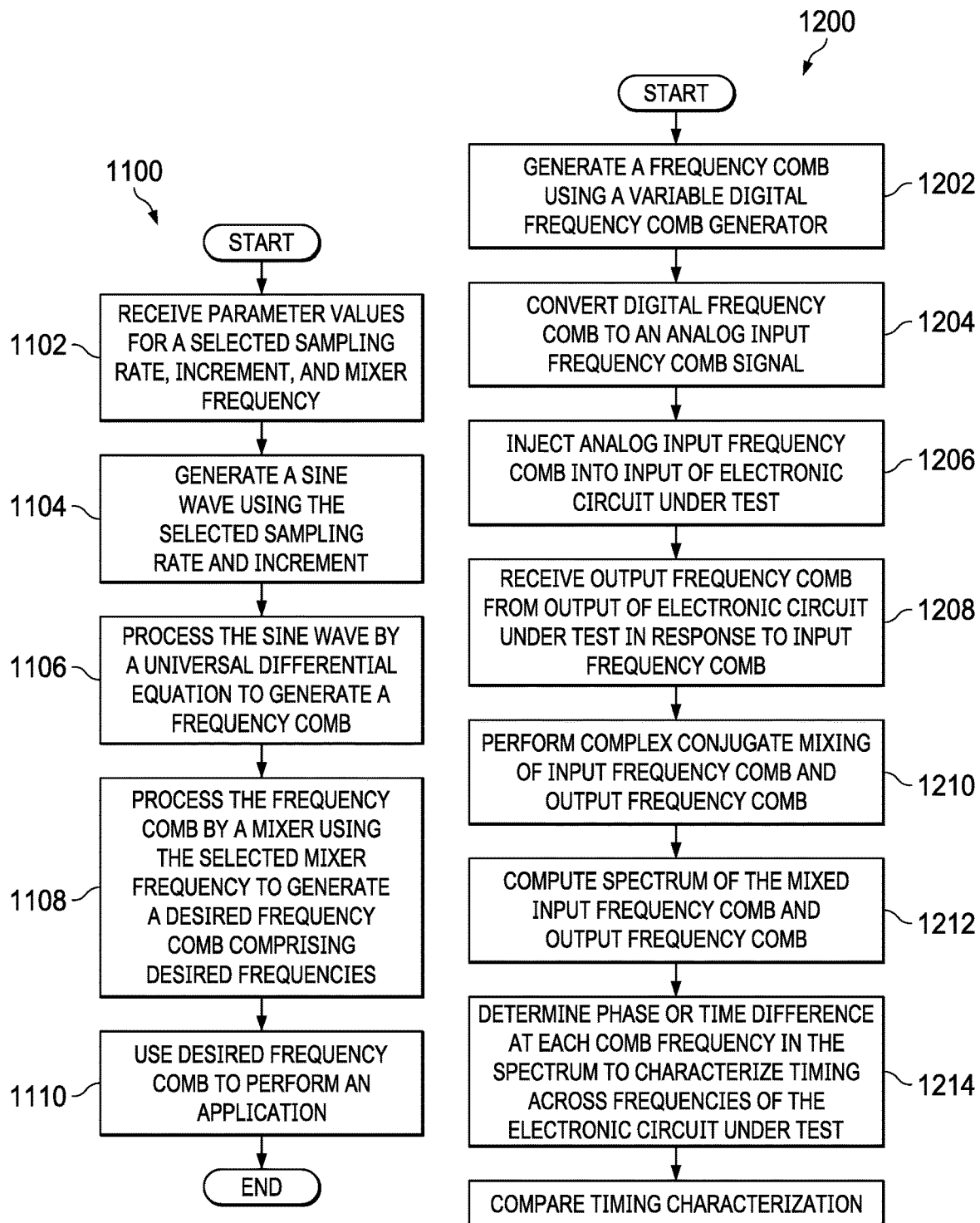
FIG. 11 is an illustration of a flowchart of a process for generating a frequency comb in accordance with an illustrative embodiment.
FIG. 12 is an illustration of a flowchart of a process for performing timing calibration across frequencies of an electronic circuit using a variable digital frequency comb generator in accordance with an illustrative embodiment.

Turning to FIG. 11, an illustration of a flowchart of process 1100 for generating a frequency comb is depicted in accordance with an illustrative embodiment. Process 1100 may be implemented, for example, in variable frequency comb generator 100 in FIG. 1.

Process 1100 begins with receiving parameter values for a selected sampling rate, increment, and mixer frequency (operation 1102). A sine wave is then generated using the selected sampling rate and increment (operation 1104). Operation 1104 may be performed using a lookup table or a CORDIC algorithm. The sine wave is processed by a universal differential equation to generate a frequency comb (operation 1106). The frequency comb generated at operation 1106 may be processed by a mixer using the selected mixer frequency to generate a desired frequency comb comprising desired frequencies (operation 1108). The desired frequency comb then may be used to perform an application (operation 1110), with the process terminating thereafter.

Turning to FIG. 12, an illustration of a flowchart of a process for performing timing calibration across frequencies of an electronic circuit using a variable digital frequency comb generator is depicted in accordance with an illustrative embodiment. Process 1200 may be implemented, for example, using arrangement of components 800 in FIG. 8.

One application of process 1200 is in narrow and wide band phase shifters within a phased array antenna, where time delay is the critical operation they perform. Another application of process 1200 is to the front-end of a receiver which must cover a relatively wide bandwidth, such as, for example, without limitation, 2-18 GHz or 2-40 GHz, and also must be able to accurately time the start of each received pulse at each frequency.

Process 1200 may begin with generating a frequency comb using a variable digital frequency comb generator in accordance with an illustrative embodiment (operation 1202). The digital frequency comb is converted to an analog input frequency comb signal (operation 1204). The analog input frequency comb is injected into the input of an electronic circuit under test (operation 1206).

An output frequency comb produced by the circuit under test in response to the input frequency comb is received (operation 1208). Complex conjugate mixing is performed on the input frequency comb and output frequency comb (operation 1210). The spectrum of the mixed input frequency comb and output frequency comb is determined (operation 1212). The phase or time difference at each comb frequency in the spectrum is determined to characterize timing across frequencies of the electronic circuit under test (operation 1214). The timing characterization across frequencies of the electronic circuit under test then may be compared to the specification for the electronic circuit (operation 1216), with the process terminating thereafter.

Figure 13:
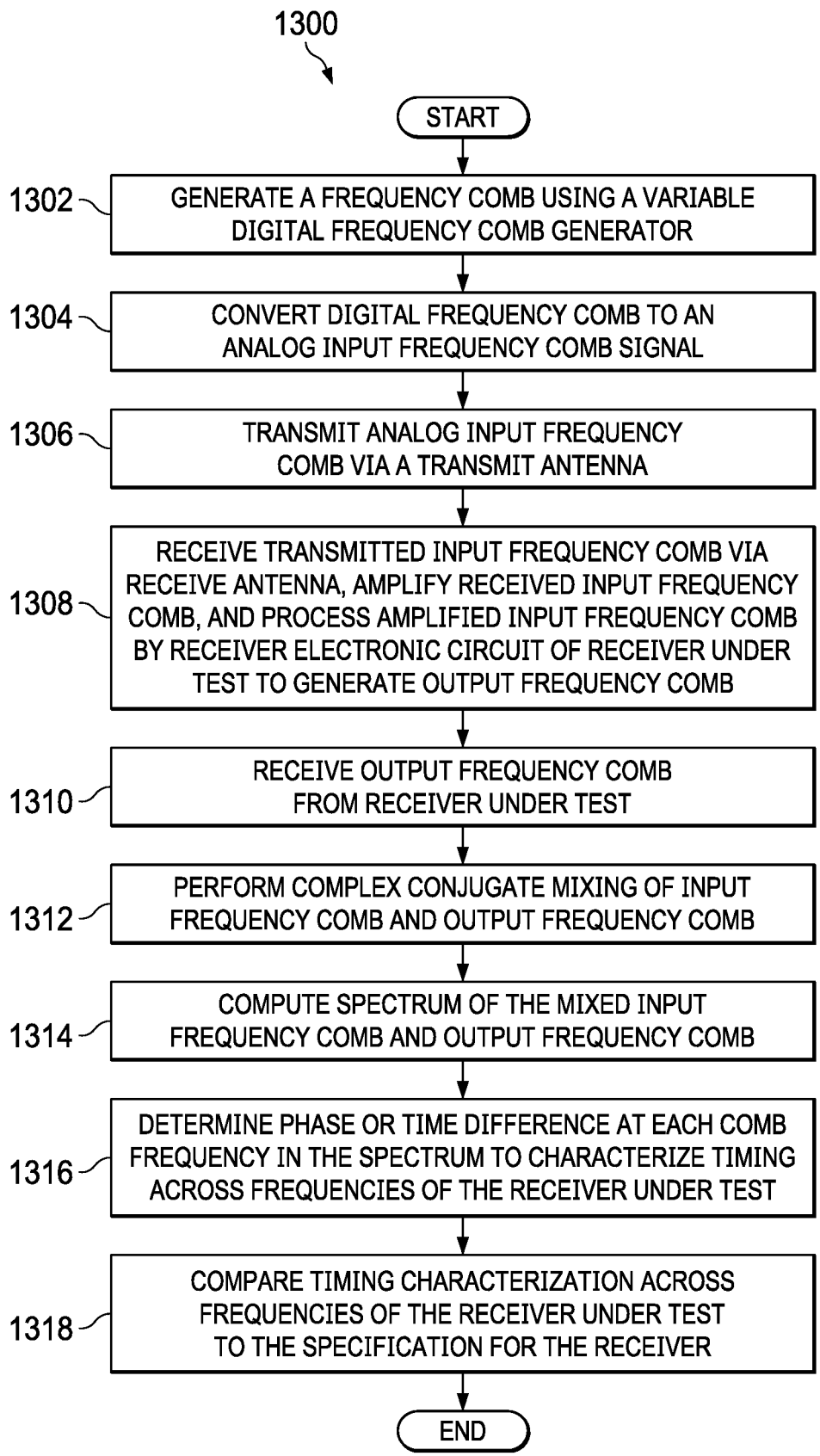
FIG. 13 is an illustration of a flowchart of a process for performing timing calibration across frequencies of a receiver using a variable digital frequency comb generator in accordance with an illustrative embodiment.

Turning to FIG. 13, an illustration of a flowchart of process 1300 for performing timing calibration across frequencies of a receiver using a variable digital frequency comb generator is depicted in accordance with an illustrative embodiment. Process 1300 may be implemented, for example, using arrangement of components 900 in FIG. 9.

Process 1300 is similar to process 1200 in FIG. 12, except that input frequency comb signal is provided to the input of the electronic circuit under test via an amplifier and transmit antenna followed by a receive antenna and amplifier that provides input to the electronic circuit under test. This allows full system testing of timing across frequencies. Process 1300 also applies to various receivers and phased array antennas, but at the full system level.

Process 1300 may begin with generating a frequency comb using a variable digital frequency comb generator in accordance with an illustrative embodiment (operation 1302). The digital frequency comb is converted to an analog input frequency comb signal (operation 1304). The analog input frequency comb is transmitted via a transmit antenna (operation 1306).

The transmitted input frequency comb is received via a receive antenna, amplified, and processed by a receiver electronic circuit of a receiver under test to generate an output frequency comb (operation 1308). The output frequency comb produced by the receiver under test in response to the input frequency comb is received (operation 1310). Complex conjugate mixing is performed on the input frequency comb and output frequency comb (operation 1312). The spectrum of the mixed input frequency comb and output frequency comb is determined (operation 1314). The phase or time difference at each comb frequency in the spectrum is determined to characterize timing across frequencies of the receiver under test (operation 1316). The timing characterization across frequencies of the receiver under test then may be compared to the specification for the receiver (operation 1318), with the process terminating thereafter.

Figure 14:
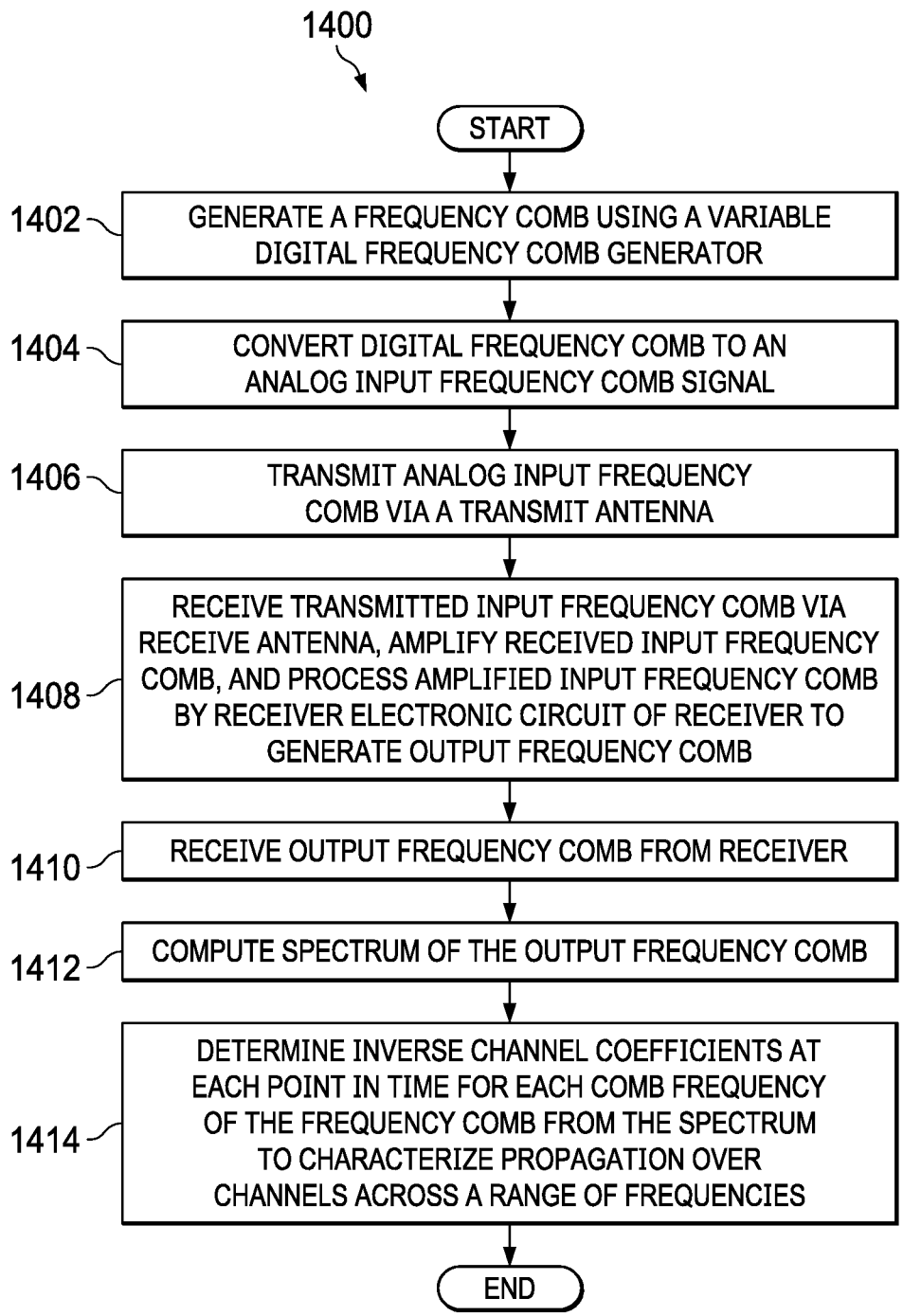
FIG. 14 is an illustration of a flowchart of a process for performing propagation measurement of a receiver using a variable digital frequency comb generator in accordance with an illustrative embodiment.

Turning to FIG. 14, an illustration of a flowchart of a process for performing propagation measurement of a receiver using a variable digital frequency comb generator is depicted in accordance with an illustrative embodiment. Process 1400 may be implemented, for example, using arrangement of components 1000 in FIG. 10. For example, without limitation, process 1400 may be used to characterize propagation over rapidly changing radio channels such as occur during flight of an aircraft or for dynamic ionospheric measurements across a wide frequency range.

Process 1400 may begin with generating a frequency comb using a variable digital frequency comb generator in accordance with an illustrative embodiment (operation 1402). The digital frequency comb is converted to an analog input frequency comb signal (operation 1404). The analog input frequency comb is transmitted via a transmit antenna (operation 1406).

The transmitted input frequency comb is received via a receive antenna, amplified, and processed by a receiver electronic circuit of a receiver under test to generate an output frequency comb (operation 1408). The output frequency comb produced by the receiver under test in response to the input frequency comb is received (operation 1410). The spectrum of the output frequency comb is computed (operation 1412). Inverse channel coefficients at each point in time for each comb frequency of the frequency comb are determined from the spectrum to characterize propagation over channels across a range of frequencies (operation 1414), with the process terminating thereafter.

Figure 15:
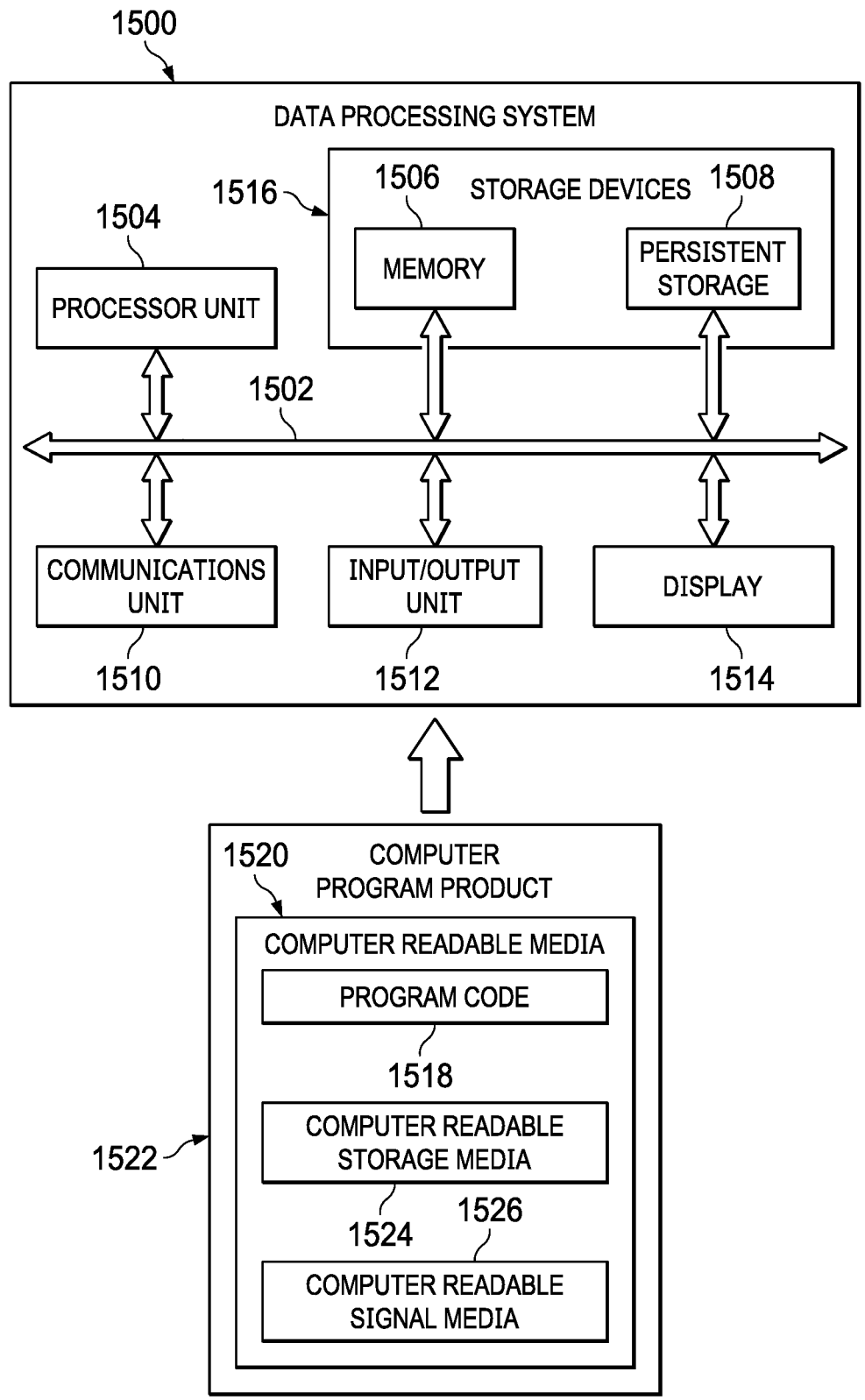
FIG. 15 is an illustration of a block diagram of a data processing system in accordance with an illustrative embodiment.

Turning to FIG. 15, an illustration of a block diagram of a data processing system is depicted in accordance with an illustrative embodiment. Data processing system 1500 is an example of one possible implementation of a data processing system in which some or all of the functions of a variable digital frequency comb generator as described herein may be implemented. For example, without limitation, data processing system 1500 is an example of one possible implementation of data processing system 110 in which variable frequency comb generator 100 in FIG. 1 is implemented.

In this illustrative example, data processing system 1500 includes communications fabric 1502. Communications fabric 1502 provides communications between processor unit 1504, memory 1506, persistent storage 1508, communications unit 1510, input/output (I/O) unit 1512, and display 1514. Memory 1506, persistent storage 1508, communications unit 1510, input/output (I/O) unit 1512, and display 1514 are examples of resources accessible by processor unit 1504 via communications fabric 1502.

Processor unit 1504 serves to run instructions for software that may be loaded into memory 1506. Processor unit 1504 may be a number of processors, a multi-processor core, or some other type of processor, depending on the particular implementation. Further, processor unit 1504 may be implemented using a number of heterogeneous processor systems in which a main processor is present with secondary processors on a single chip. As another illustrative example, processor unit 1504 may be a symmetric multi-processor system containing multiple processors of the same type.

Memory 1506 and persistent storage 1508 are examples of storage devices 1516. A storage device is any piece of hardware that is capable of storing information, such as, for example, without limitation, data, program code in functional form, and other suitable information either on a temporary basis or a permanent basis. Storage devices 1516 also may be referred to as computer readable storage devices in these examples. Memory 1506, in these examples, may be, for example, a random access memory or any other suitable volatile or non-volatile storage device. Persistent storage 1508 may take various forms, depending on the particular implementation.

For example, persistent storage 1508 may contain one or more components or devices. For example, persistent storage 1508 may be a hard drive, a flash memory, a rewritable optical disk, a rewritable magnetic tape, or some combination of the above. The media used by persistent storage 1508 also may be removable. For example, a removable hard drive may be used for persistent storage 1508.

Communications unit 1510, in these examples, provides for communications with other data processing systems or devices. In these examples, communications unit 1510 is a network interface card. Communications unit 1510 may provide communications through the use of either or both physical and wireless communications links.

Input/output (I/O) unit 1512 allows for input and output of data with other devices that may be connected to data processing system 1500. For example, input/output (I/O) unit 1512 may provide a connection for user input through a keyboard, a mouse, and/or some other suitable input device. Further, input/output (I/O) unit 1512 may send output to a printer. Display 1514 provides a mechanism to display information to a user.

Instructions for the operating system, applications, and/or programs may be located in storage devices 1516, which are in communication with processor unit 1504 through communications fabric 1502. In these illustrative examples, the instructions are in a functional form on persistent storage 1508. These instructions may be loaded into memory 1506 for execution by processor unit 1504. The processes of the different embodiments may be performed by processor unit 1504 using computer-implemented instructions, which may be located in a memory, such as memory 1506.

These instructions are referred to as program instructions, program code, computer usable program code, or computer readable program code that may be read and executed by a processor in processor unit 1504. The program code in the different embodiments may be embodied on different physical or computer readable storage media, such as memory 1506 or persistent storage 1508.

Program code 1518 is located in a functional form on computer readable media 1520 that is selectively removable and may be loaded onto or transferred to data processing system 1500 for execution by processor unit 1504. Program code 1518 and computer readable media 1520 form computer program product 1522 in these examples. In one example, computer readable media 1520 may be computer readable storage media 1524 or computer readable signal media 1526.

Computer readable storage media 1524 may include, for example, an optical or magnetic disk that is inserted or placed into a drive or other device that is part of persistent storage 1508 for transfer onto a storage device, such as a hard drive, that is part of persistent storage 1508. Computer readable storage media 1524 also may take the form of a persistent storage, such as a hard drive, a thumb drive, or a flash memory, that is connected to data processing system 1500. In some instances, computer readable storage media 1524 may not be removable from data processing system 1500.

In these examples, computer readable storage media 1524 is a physical or tangible storage device used to store program code 1518 rather than a medium that propagates or transmits program code 1518. Computer readable storage media 1524 is also referred to as a computer readable tangible storage device or a computer readable physical storage device. In other words, computer readable storage media 1524 is a media that can be touched by a person.

Alternatively, program code 1518 may be transferred to data processing system 1500 using computer readable signal media 1526. Computer readable signal media 1526 may be, for example, a propagated data signal containing program code 1518. For example, computer readable signal media 1526 may be an electromagnetic signal, an optical signal, and/or any other suitable type of signal. These signals may be transmitted over communications links, such as wireless communications links, optical fiber cable, coaxial cable, a wire, and/or any other suitable type of communications link. In other words, the communications link and/or the connection may be physical or wireless in the illustrative examples.

In some illustrative embodiments, program code 1518 may be downloaded over a network to persistent storage 1508 from another device or data processing system through computer readable signal media 1526 for use within data processing system 1500. For instance, program code stored in a computer readable storage medium in a server data processing system may be downloaded over a network from the server to data processing system 1500. The data processing system providing program code 1518 may be a server computer, a client computer, or some other device capable of storing and transmitting program code 1518.

The different components illustrated for data processing system 1500 are not meant to provide architectural limitations to the manner in which different embodiments may be implemented. The different illustrative embodiments may be implemented in a data processing system including components in addition to and/or in place of those illustrated for data processing system 1500. Other components shown in FIG. 15 can be varied from the illustrative examples shown. The different embodiments may be implemented using any hardware device or system capable of running program code. As one example, data processing system 1500 may include organic components integrated with inorganic components and/or may be comprised entirely of organic components excluding a human being. For example, a storage device may be comprised of an organic semiconductor.

In another illustrative example, processor unit 1504 may take the form of a hardware unit that has circuits that are manufactured or configured for a particular use. This type of hardware may perform operations without needing program code to be loaded into a memory from a storage device to be configured to perform the operations.

For example, when processor unit 1504 takes the form of a hardware unit, processor unit 1504 may be a circuit system, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, a programmable array logic, a field programmable logic array, a field programmable gate array, and other suitable hardware devices. With this type of implementation, program code 1518 may be omitted, because the processes for the different embodiments are implemented in a hardware unit.

In still another illustrative example, processor unit 1504 may be implemented using a combination of processors found in computers and hardware units. Processor unit 1504 may have a number of hardware units and a number of processors that are configured to run program code 1518. With this depicted example, some of the processes may be implemented in the number of hardware units, while other processes may be implemented in the number of processors.

In another example, a bus system may be used to implement communications fabric 1502 and may be comprised of one or more buses, such as a system bus or an input/output bus. Of course, the bus system may be implemented using any suitable type of architecture that provides for a transfer of data between different components or devices attached to the bus system.

Additionally, communications unit 1510 may include a number of devices that transmit data, receive data, or both transmit and receive data. Communications unit 1510 may be, for example, a modem or a network adapter, two network adapters, or some combination thereof. Further, a memory may be, for example, memory 1506, or a cache, such as that found in an interface and memory controller hub that may be present in communications fabric 1502.

The flowcharts and block diagrams described herein illustrate the architecture, functionality, and operation of possible implementations of systems, methods, and computer program products according to various illustrative embodiments. In this regard, each block in the flowcharts or block diagrams may represent a module, segment, or portion of code, which comprises one or more executable instructions for implementing the specified logical function or functions. It should also be noted that, in some alternative implementations, the functions noted in a block may occur out of the order noted in the figures. For example, the functions of two blocks shown in succession may be executed substantially concurrently, or the functions of the blocks may sometimes be executed in the reverse order, depending upon the functionality involved.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method of generating a frequency comb, comprising: generating a sine wave; and
processing the sine wave by a universal differential equation to generate the frequency comb from the sine wave.

2. The method of claim 1, wherein generating the sine wave comprises generating the sine wave comprising samples at a selected sampling rate and a selected increment corresponding to a number of samples for a period of the sine wave.

3. The method of claim 2, wherein generating the sine wave comprises generating the sine wave using a lookup table.

4. The method of claim 2, wherein generating the sine wave comprises generating the sine wave using a CORDIC algorithm.

5. The method of claim 2, wherein:
a starting frequency in the frequency comb is a function of the selected sampling rate and the selected increment;
a number of frequencies in the frequency comb is a function of the selected increment; and
a frequency spacing of the frequencies in the frequency comb is a function of the selected sampling rate and the selected increment.

6. The method of claim 1, wherein the universal differential equation is:

$$z_i = (3y3 \cdot y2 \cdot y1 - 2(1-n^{-2}) \cdot y2^3)/y1^2 - y_1 + 4y_2 - 6y_3 + 4y_4,$$

wherein, $$y1 = -11/6 \cdot y_1 + 3y_2 - 3/2 \cdot y_3 + \frac{1}{3} \cdot y_4,$$

$$y2 = 2y_1 - 5y_2 + 4y_3 - y_4,$$

$$y3 = -y_1 + 3y_2 - 3y_3 + y_4, \text{ and}$$

$y_1$, $y_2$, $y_2$, and $y_4$ are sequential samples in time of the sine wave.

7. The method of claim 6, wherein processing the sine wave by the universal differential equation comprises processing the sine wave by a universal digital filter comprising a pipeline circuit.

8. The method of claim 1 further comprising converting the frequency comb to desired frequencies to form a desired frequency comb.

9. The method of claim 1 further comprising using the frequency comb in an application selected from the group of applications consisting of performing timing calibration across frequencies of an electronic circuit, performing timing calibration across frequencies of a receiver, and performing propagation measurement of a receiver.

10. A method of generating a frequency comb, comprising:
selecting a sampling rate and an increment;
generating a sine wave comprising samples at the selected sampling rate and the selected increment corresponding to a number of samples for a period of the sine wave; and
processing the sine wave to generate the frequency comb;
wherein:
a starting frequency in the frequency comb is a function of the selected sampling rate and the selected increment;
a number of frequencies in the frequency comb is a function of the selected increment; and
a frequency spacing of the frequencies in the frequency comb is a function of the selected sampling rate and the selected increment.

11. The method of claim 10, wherein processing the sine wave to generate the frequency comb comprises processing the sine wave by a universal differential equation to generate the frequency comb.

12. An apparatus for generating a frequency comb, comprising:
a sine wave generator configured to generate a sine wave; and
a universal digital filter configured to process the sine wave by a universal differential equation to generate the frequency comb.

13. The apparatus of claim 12, wherein the sine wave generator is configured to generate the sine wave comprising samples at a selected sampling rate and a selected increment corresponding to a number of samples for a period of the sine wave.

14. The apparatus of claim 13, wherein the sine wave generator is configured to generate the sine wave using a lookup table.

15. The apparatus of claim 13, wherein the sine wave generator is configured to generate the sine wave using a CORDIC algorithm.

16. The apparatus of claim 13, wherein:
a starting frequency in the frequency comb is a function of the selected sampling rate and the selected increment;
a number of frequencies in the frequency comb is a function of the selected increment; and
a frequency spacing of the frequencies in the frequency comb is a function of the selected sampling rate and the selected increment.

17. The apparatus of claim 12, wherein the universal differential equation is:

$$z_i = (3y3 \cdot y2 \cdot y1 - 2(1-n^{-2}) \cdot y2^3)/y1^2 - y_1 + 4y_2 - 6y_3 + 4y_4,$$

wherein, $$y1 = -11/6 \cdot y_1 + 3y_2 - 3/2 \cdot y_3 + \frac{1}{3} \cdot y_4,$$

$$y2 = 2y_1 - 5y_2 + 4y_3 - y_4,$$

$$y3 = -y_1 + 3y_2 - 3y_3 + y_4, \text{ and}$$

$y_1$, $y_2$, $y_3$, and $y_4$ are sequential samples in time of the sine wave.

18. The apparatus of claim 17, wherein the universal digital filter comprises a pipeline circuit for processing the sine wave using the universal differential equation to generate the frequency comb.

19. The apparatus of claim 12 further comprising a mixer configured to convert the frequency comb to desired frequencies to form a desired frequency comb.

20. The apparatus of claim 12, wherein the sine wave generator and the universal digital filter are implemented in a field-programmable gate array, an application specific integrated circuit, or a data processing system.

* * * * *